United States Patent [19]
Mihira et al.

[11] Patent Number: 5,377,616
[45] Date of Patent: Jan. 3, 1995

[54] METHOD FOR VAPORIZING AND SUPPLYING ORGANOMETAL COMPOUNDS

[75] Inventors: Hiroshi Mihira; Tetsuo Shimizu, both of Kyoto; Kazuhiro Hirahara; Toshinobu Ishihara, both of Niigata; Seiki Takaya, Kanagawa, all of Japan

[73] Assignees: Stec, Inc., Kyoto; Shin-Etsu Chemical Co., Ltd., Tokyo, both of Japan

[21] Appl. No.: 150,532

[22] Filed: Nov. 9, 1993

Related U.S. Application Data

[60] Continuation of Ser. No. 905,620, Jun. 29, 1992, abandoned, which is a division of Ser. No. 500,772, Mar. 28, 1990, abandoned.

[30] Foreign Application Priority Data

Mar. 29, 1989 [JP] Japan .................................. 1-77020

[51] Int. Cl.$^6$ ................................................ C30B 25/14
[52] U.S. Cl. ..................................... 117/104; 117/201; 117/919; 117/925; 437/107; 437/108
[58] Field of Search ................ 156/610, 611, 612, 613, 156/614; 437/105, 107, 108

[56] References Cited

U.S. PATENT DOCUMENTS

| | | | |
|---|---|---|---|
| 4,147,571 | 4/1979 | Stringfellow et al. | 148/175 |
| 4,193,835 | 3/1980 | Inoue et al. | 156/606 |
| 4,517,220 | 5/1985 | Rose | 427/8 |
| 4,533,410 | 8/1985 | Ogura et al. | 148/175 |

OTHER PUBLICATIONS

"The operation of metalorganic bubblers at reduced pressure."; Hersee, S. D. et al; Journal of Vacuum Science; Mar.-Apr. 1990; vol. 8, No. 2, pp. 800-804.
"Epitaxy from flowing vapors of organometallic compounds and hydrides at Knudsen Number of 0.05-10"; Zhuk, B. V. et al; Soviet Technical Physics Letters; Sep. 1981, vol. 7, No. 9, pp. 485-486.

*Primary Examiner*—R. Bruce Breneman
*Assistant Examiner*—Felisa Garrett
*Attorney, Agent, or Firm*—McAulay Fisher Nissen Goldberg & Kiel

[57] ABSTRACT

A method for vaporizing an organometal compound and supplying the resulting vapor thereof to a crystal growth chamber which comprises the steps of heating an organometal compound to a predetermined temperature to obtain vapor of the compound at a predetermined vapor pressure and supplying, in a constant flow rate, the vapor to the surface of a substrate heated under a reduced pressure: an apparatus for vaporizing an organometal compound and supplying the resulting vapor thereof to a crystal growth chamber 11 comprising a first gas flow path for the vapor of the organometal compound which connects a container 20, in which the organometal compound is charged, to a crystal growth chamber heated under a reduced pressure through a first valve 21, a first massflow controller 22 and a second valve 23 in this order; and a constant temperature oven 24 and 25 for controlling the temperature of the container 20 and the first gas flow path extending from the container 20 to the second valve 23, are herein disclosed. The method and the apparatus makes it possible to form a thin film on substrate having even a large surface area and uniform composition and thickness with good reproducibility and to provide an epitaxial thin film of a compound semiconductor having good sharpness of the crystal growing boundary; the method further makes it possible to prevent the contamination of the solid organometal compound and to provide good workability.

9 Claims, 5 Drawing Sheets

METHOD FOR VAPORIZING AND SUPPLYING ORGANOMETAL COMPOUNDS

This is a continuation of application Ser. No. 07/905,620, filed Jun. 29, 1992, now abandoned which, in turn, is a division of application Ser. No. 07/500,772, filed Mar. 28, 1990 now abandoned.

BACKGROUND OF THE INVENTION

The present invention relates to a method for vaporizing and supplying an organometal compound and an apparatus for carrying out the method and more specifically to a method and an apparatus for vaporizing and supplying an organometal compound used as a starting material for manufacturing an epitaxial thin film of a compound semiconductor according to the metal organic chemical vapor deposition (MOCVD) technique.

The MOCVD technique has become of major interest recently as a means for forming, on the surface of a substrate, thin film semiconductors of compound or mixed crystal of III–V group elements or II–IV group elements. According to the MOCVD technique, a crystalline thin film is formed by thermally decomposing an organometal compound such as $(CH_3)_3Ga$ or $(CH_3)_3Al$ as a starting material and depositing the resulting vapor of the decomposed organometal compound on to the surface of a substrate. In particular, this technique makes it possible to form a thin film having uniform thickness on a substrate having a large surface area and is excellent in mass-productivity, controllability of the film composition or the like.

When an organometal compound is employed in the MOCVD technique, a carrier gas such as hydrogen gas is bubbled through the organometal compound so that it comes in contact with the compound to give a carrier gas stream saturated with the vapor of the organometal compound and the carrier gas is guided to a chamber for growing crystals in which a crystal thin film grows on a substrate. In this respect, the MOCVD technique is roughly divided into two groups, one of which is called "normal pressure MOCVD" and the other of which is called "low pressure MOCVD" depending on the pressure established in the crystal-growth chamber. In either of these techniques, the pressure at the both of carrier gas inlet and outlet of a container for the organometal compound as the starting material is adjusted with a valve so that it is equal to 1 atm.

There has conventionally been known an apparatus which is shown by a sectional view in FIG. 6 as such an apparatus for vaporizing an organometal compound and supplying the resulting vapor thereof to a crystal growth chamber, in which a carrier gas of this kind is employed. In FIG. 6, the numerical order 1 represents a container for a carrier gas such as $H_2$ gas; 2 represents a valve for reducing pressure; 3 represents a massflow controller for controlling the massflow of the carrier gas; 4 represents a liquid organometal compound; and 5 represents a cylinder cabinet which is filled with such a liquid organometal compound 4. The numerical order 6 represents a constant temperature oven; 7 represents an inlet valve; and 8 represents a tube for introduction (a dipping tube) which serves to introduce the carrier gas into the lower portion of the cylinder cabinet 5. The numerical order 9 represents an outlet valve; and 10 represents a needle valve which serves to maintain the pressure in the vicinity of an inlet and an outlet of the cylinder cabinet 5 at about 1 atm. The numerical order 11 represents a crystal growth chamber for growing crystals; 12 represents a heater; 13 represents a substrate; and 14 represents a vacuum pump.

In case of this apparatus to be employed for manufacturing a thin film of a semiconductor, first the temperature of the constant temperature oven 6 is correctly controlled to thus determine the vapor pressure of the organometal compound 4. Then the carrier gas, of which massflow has been precisely controlled by the massflow controller 3, is introduced into the cylinder cabinet 5 by opening the valve 7 and, thereafter, the valve 9 is opened to guide the carrier gas containing the vaporized organometal compound in a desired concentration towards the crystal growth chamber 11. A reduced pressure is established in the crystal-growth chamber 11 by the vacuum pump 14. Thus, an epitaxial thin film of a semiconductor resulting from the organometal compound grows on the surface of the substrate 13.

However, in case of using an organometal compound in a solid state at an ordinary temperature as a starting material for a semiconductor in such as the above explained apparatus. The more the amount of the solid organometal compound charged in the cylinder cabinet 5 decreases, the more the composition of the resulting compound semiconductor varies and deviates from the desired one. Therefore, semiconductor thin films of only unacceptable crystallinity would be obtained. This is because, in case of a solid organometal compound to be employed as a starting semiconductor material, the contact between the carrier gas and the organometal compound takes place on a limited area, i.e., simply on the surface of the solid unlike the case wherein a liquid organometal compound is used and, as a result, the concentration of the organometal compound in the carrier gas does not reach that corresponding to the saturated vapor pressure thereof. Moreover, it is also assumed that since the efficiency of the heat exchange between the organometal compound and the constant temperature oven varies depending on the flow rate of the carrier gas, a temperature difference arises between the oven and the organometal compound and thus a desired amount of vapor cannot be supplied to the crystal growth chamber.

To enhance the efficiency of contact between a solid organometal compound and a carrier, there have been proposed a variety of methods or ideas. For instance, a method in which solid organometal compounds are employed in the form of powder or needles is disclosed in Japanese Patent Provisional Publication 63-55194 and 63-11598. Besides, Collected Resume of 49th Meeting of Society of Applied Physics, 5P-W-7, p. 237 discloses that a porous filter for dispersing a carrier gas is disposed at the apex of dip tube inserted in a cylinder cabinet.

However, in either of these cases, it is impossible to precisely control the quantity of the vaporized organometal compound at the outlet of the cylinder within a variation ranging from 5 to 10%. In particular, in case of using organometal compound in the form of powder as in Japanese Patent Provisional Publication 63-55194 and 63-11598, it is necessary to introduce such powder into the cylinder cabinet through a blank plug or the like after pulverizing the solid organometal compound externally since it is very difficult to make pulverization within the cylinder cabinet. Besides, the organometal compounds are in general highly toxic and highly reactive with oxygen and water. For this reason, a special installation to isolate from external atmosphere is needed to introduce the powder into the cylinder cabinet and, further, the powder as the starting material is often contaminated during pulverization and charging operations.

It is also necessary to maintain the pressure in the vicinity of the carrier gas inlet and outlet for the cylinder cabinet at ordinary pressure even if crystals grow according to the low pressure MOCVD technique. For this reason, it is needed to continuously perform fine adjustment of the needle valve 10 as shown in FIG. 6 which illustrates the structure of a conventional apparatus for vaporizing an organometal compound and supplying the resulting vapor thereof to a crystal growth chamber. The control of the amount of the vaporized organometal compound thus requires a great deal of labor. Furthermore, it is difficult to perform an instantaneous interruption of the supplying of the starting materials and rapid switching of them. Therefore, the sharpness of the crystal growing boundary is greatly impaired.

SUMMARY OF THE INVENTION

Accordingly, an object of the present invention is to provide a method for vaporizing a solid or liquid organometal compound as a starting material for manufacturing a compound semiconductor thin film and supplying the resulting vapor of the organometal compound to a crystal growth chamber, the method making it possible to form a uniform thin film even on a substrate having a large surface area with good reproducibility and to provide an epitaxial thin film of a compound semiconductor having good sharpness of the crystal growing boundary.

Another object of the present invention is to provide a method for vaporizing a solid organometal compound as a starting material for manufacturing a compound semiconductor thin film and supplying the resulting vapor of the organometal compound to a crystal growth chamber, which makes it possible to prevent the contamination of the organometal compound during handling the same and to provide good workability.

A further object of the present invention is to provide an apparatus for carrying out the aforementioned methods.

According to an aspect of the present invention, there is provided a method for vaporizing an organometal compound and supplying the resulting vaporized organometal compound to a crystal growth chamber which comprises the steps of heating an organometal compound to a predetermined temperature to obtain vapor of the organometal compound at a predetermined vapor pressure and supplying a constant amount of the vapor to the surface of a substrate heated in the crystal growth chamber under a reduced pressure.

According to another aspect of the present invention, there is provided a method for vaporizing an organometal compound and supplying the resulting vaporized organometal compound to a crystal growth chamber which comprises the steps of heating an organometal compound to a predetermined temperature to obtain vapor of the compound at a predetermined vapor pressure and transferring a constant amount of the vapor while the vapor is maintained at a temperature 10° to 50° C. higher than the predetermined value to supply the vapor to the surface of a substrate which is heated in the crystal growth chamber under a reduced pressure.

According to a third aspect of the present invention, there is provided an apparatus for vaporizing an organometal compound and supplying the resulting vapor thereof to a crystal growth chamber, which comprises a first gas flow path for the vapor of the organometal compound which connects a container filled with the organometal compound to a crystal growth chamber heated under a reduced pressure through a first valve, a first massflow controller and a second valve in this order; and a constant temperature oven for controlling the temperature of the container and the first gas flow path extending from the container to the second valve.

According to a fourth aspect of the present invention, there is provided another apparatus for vaporizing an organometal compound and supplying the resulting vapor thereof to a crystal growth chamber, which comprises a first gas flow path for the vapor of the organometal compound which connects a container filled with the organometal compound to a crystal growth chamber heated under a reduced pressure through a first valve, a first massflow controller and a second valve in this order; a second gas flow path for a carrier gas which connects a carrier gas source to the second valve through a second massflow controller and a heat exchanger in this order; and a constant temperature oven for controlling the temperature of the container and the gas flow path extending from the container to the second valve and the heat exchanger.

BRIEF EXPLANATION OF THE DRAWINGS

The present invention will hereunder be described in more detail with reference to the accompanying drawings, in which.

DETAILED EXPLANATION OF THE INVENTION

In the present invention, the organometal compounds used as the starting material for manufacturing uniform thin films of compound semiconductors may be in either the solid state or the liquid state at ordinary temperature. The organometal compounds are preferably substituted organometal compounds represented by the following general formulae: $R_nM$; $R_{n-m}MH_m$ and $R_{n-m}MX_m$ (in these general formulas, R represents an alkyl group having 1 to 4 carbon atoms; M represents a metal element of Groups II, III, V or VI of Periodic Table; X represents a halogen atom; and n is an integer of 2 or 3 and m is an integer ranging from 1 to 3).

In the method of this invention, the temperature of the organometal compound stored in its container is preferably maintained at 50° to 80° C. if it is in the solid state or it may be heated to its melting point. Moreover, a carrier gas for promoting the thermal decomposition of the organometal compound in the crystal growth chamber such as hydrogen gas may be employed and its flow rate is preferably adjusted to 10 to 300 ml/min.

Figure 1:
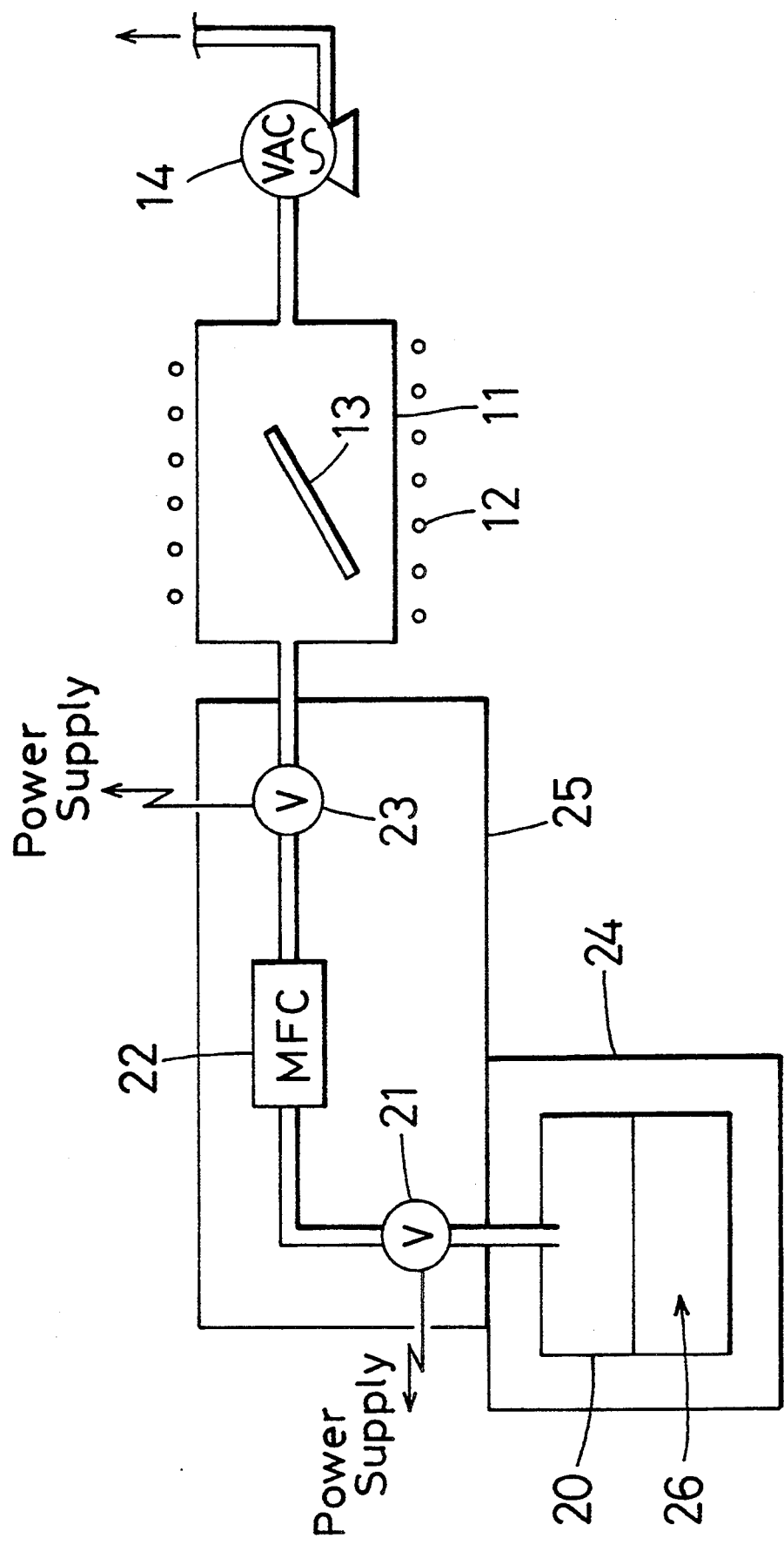
FIGS. 1 to 3 are schematic diagrams for illustrating the constructions of specific embodiments of the apparatus for vaporizing an organometal compound and supplying the resulting vapor of the organometal compound to a crystal growth chamber according to the present invention.

Referring now to FIG. 1, there is shown an embodiment of the apparatus of the present invention which comprises a first gas flow path for the vapor of the organometal compound which connects a container 20, in which the organometal compound 26 is charged, to a crystal growth chamber 11 heated under a reduced pressure through a first valve 21, a first massflow controller 22 and a second valve 23 in this order. The apparatus is further characterized in that the container 20 and the first gas flow path extending from the container 20 to the crystal growth chamber 11 are held in constant temperature oven 24 or 25 for controlling the temperature thereof to a predetermined value preferably falling within the foregoing range.

Figure 2:
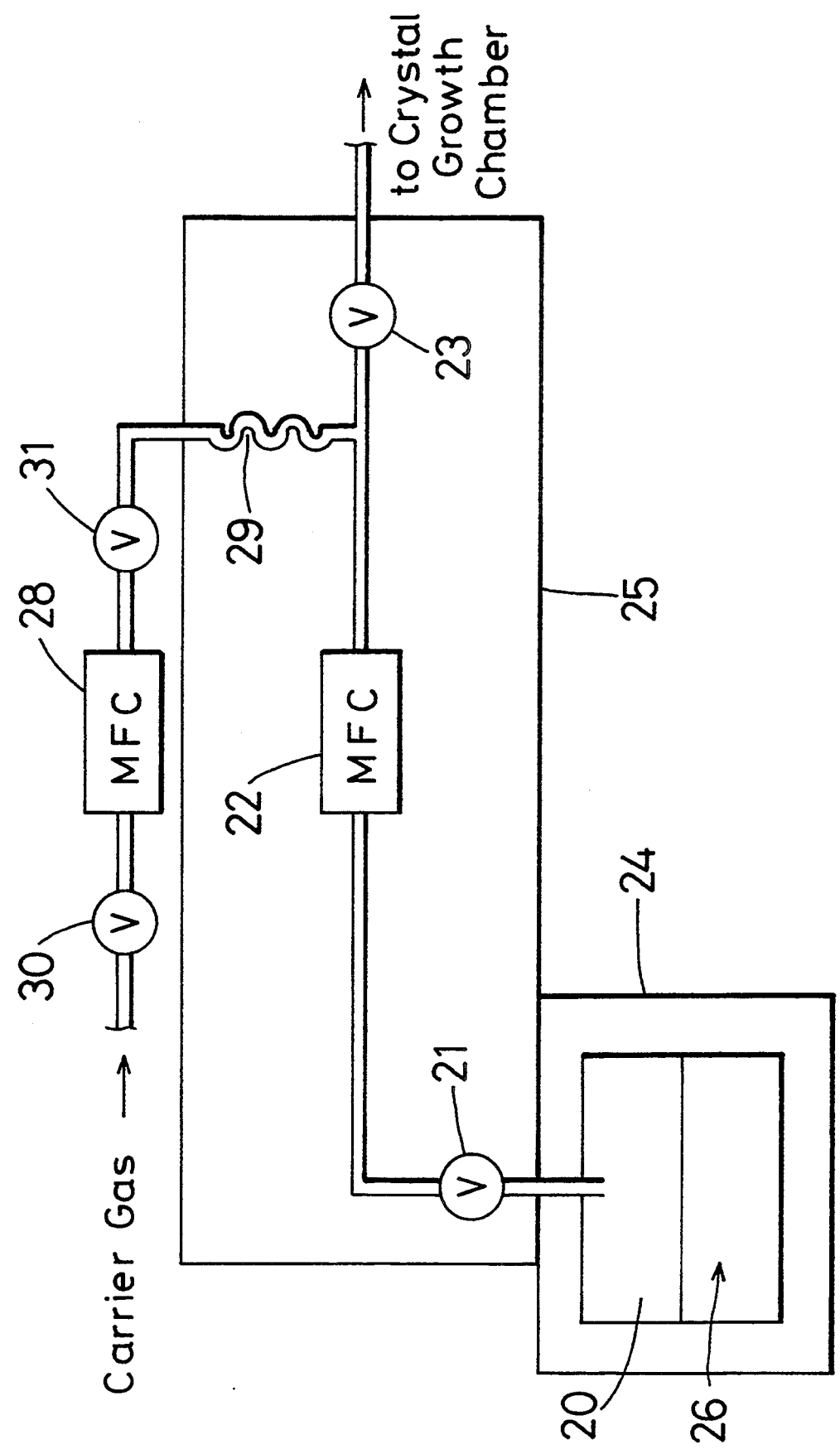

Then referring to FIG. 2, there is shown another embodiment of the apparatus for vaporizing an organometal compound and supplying the resulting vapor of the organometal compound to a crystal growth chamber according to the present invention. This second embodiment comprises a first gas flow path for the vapor of the organometal compound which connects a container 20 filled with the organometal compound 26 to a crystal growth chamber 11 heated under a reduced pressure through a first valve 21, a first massflow controller 22 and a second valve 23 in this order (see FIG. 1); a second gas flow path for a carrier gas which connects a carrier gas source (not shown) to the second valve 23 through a second massflow controller 28 and a heat exchanger 29 in this order. In this embodiment, the container 20, the first gas flow path extending from the container 20 to the crystal growth chamber 11 and the heat exchanger 29 of the second gas flow path for the carrier gas are likewise held in the constant temperature oven 24 or 25 for controlling the temperature thereof to a predetermined value. As shown in FIG. 2, the second gas flow path for the carrier gas further comprises valves 30 (disposed in front of the second massflow controller 28) and 31 (disposed between the massflow controller 28 and the heat exchanger 29). According to this apparatus, the heat decomposition in the crystal growth chamber may be accelerated by the introduction of a carrier gas through the second gas flow path as has been explained above.

A third embodiment of the apparatus of the present invention is a variation of the foregoing first and second embodiments. More specifically, the container 20 and other equipments and tools such as the first gas flow paths are placed in separate constant temperature ovens 24 and 25, respectively as shown in FIGS. 1 and 2. According to this embodiment, the temperature of the container 20 and hence the organometal compound 26 contained therein can be adjusted to a temperature different from that of the devices 21, 22, 23, 29 or the like.

A fourth embodiment of the apparatus according to the present invention is a further variation of those shown in FIGS. 1 and 2. In this embodiment, either or both of the first valves 21 and second valves 23 are replaced with pneumatically controllable remote operated valves. Thus the flow rate of the vaporized organometal compound can be remote controlled.

Figure 3:
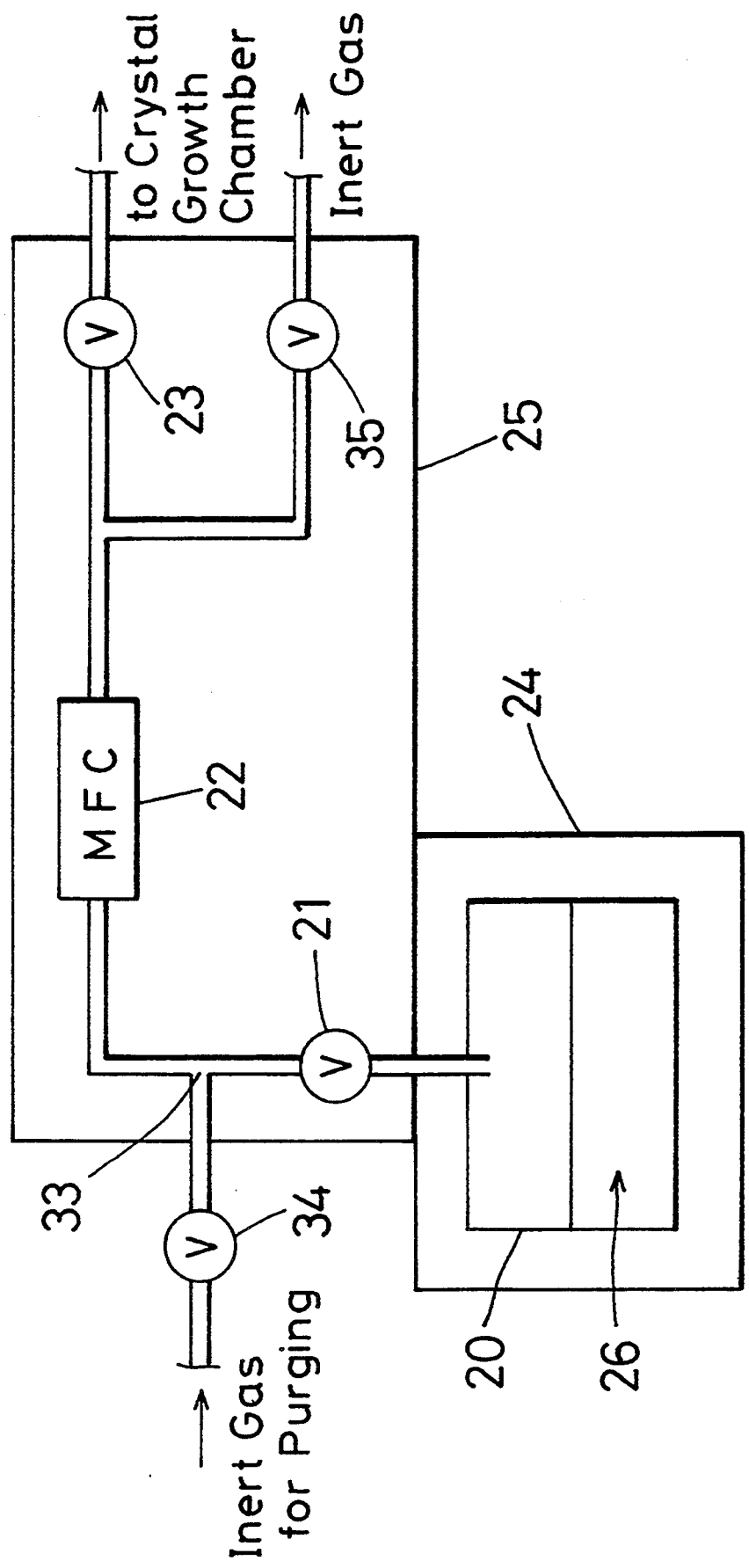
Figure 4:
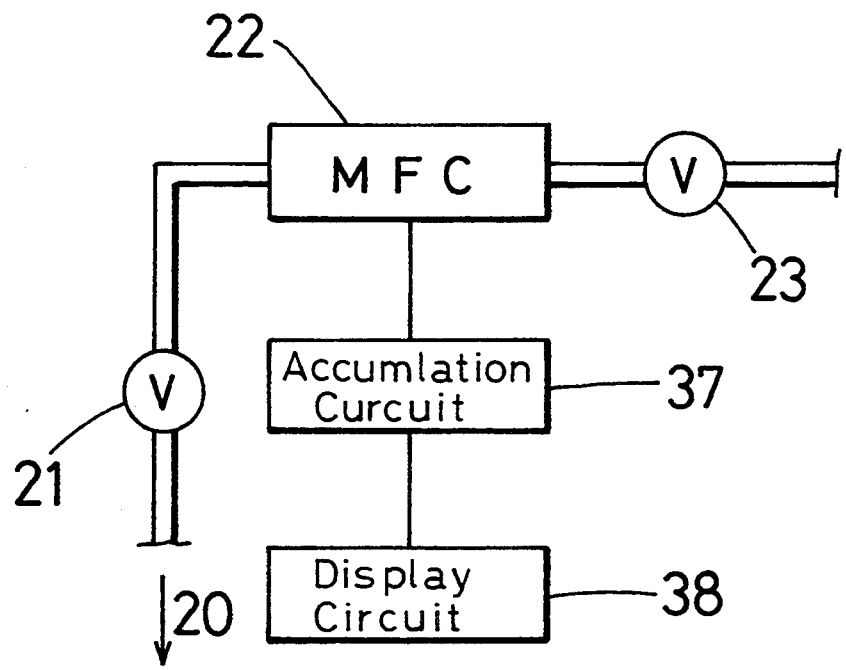
FIGS. 4 and 5 are schematic diagrams for illustrating the major portions of other specific embodiments of the apparatus for vaporizing an organometal compound and supplying the resulting vapor thereof to a crystal growth chamber according to the present invention.

A fifth embodiment of the apparatus according to the present invention is another variation of the foregoing embodiments. In this embodiment, a discharge outlet or port 33 for discharging an inert gas from its source (not shown), which is connected to the middle portion of the first gas flow path between the first valve 21 and the massflow controller 22, through a valve 34 as shown in FIG. 3. This embodiment makes it possible to surely clarify the system for supplying the vaporized organometal compound since an inert gas can be passed therethrough at a relatively high flow rate to perform purging of the system. The purging gas may be discharged from the system through a discharge valve 35.

Figure 5:
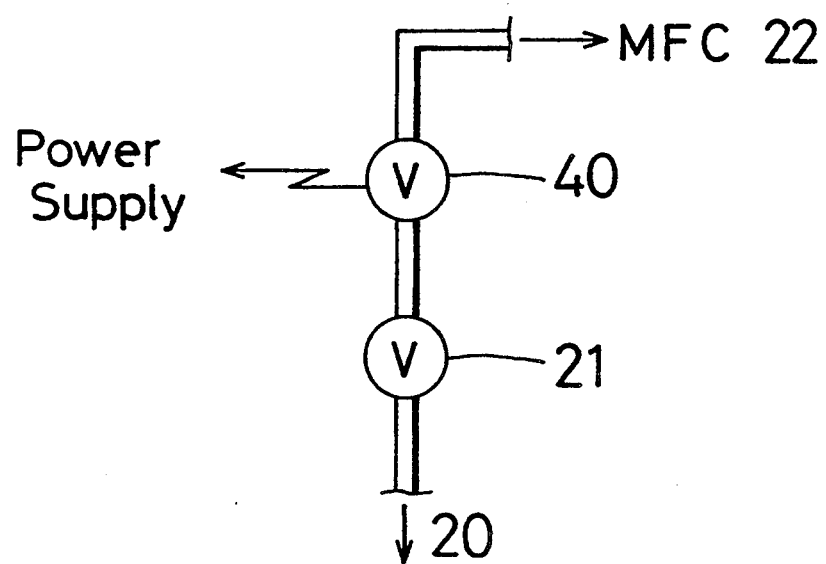

The apparatus according to the present invention may further be provided with a means 37 for accumulating the massflow determined by the massflow controller 22 and a means 38 for displaying the resulting amount of the organometal compound consumed, which is outputted from the accumulation means 37 (see FIG. 5). These means are connected to the first massflow controller 22 and the total amount of the compound employed can easily be evaluated and displayed by integrating, in the accumulation means, the values detected by the massflow controller 22. In addition, the amount of the organometal compound 26 remaining in the container or cylinder cabinet 20 can always be correctly estimated and the time at which the cabinet should be exchanged can easily be detected.

The present invention is explained in more specifically on the basis of the specific embodiments described with reference to the attached drawings.

FIG. 1 shows a schematic diagram illustrating the structure of the apparatus for vaporizing an organometal compound and supplying the resulting vapor of the organometal compound to a crystal growth chamber according to the present invention. As shown in FIG. 1, a cylinder cabinet 20 containing an organometal compound 26 is connected to a massflow controller 22 through a pneumatically operated valve 21. The massflow controller 22 is further connected to a crystal growth chamber 11 through a pneumatically operated valve 23 for interrupting the supply of the vapor of the organometal compound 26. The crystal growth chamber 11 is connected to a vacuum pump 14 to thus establish a desired pressure in the chamber. Each of the foregoing connections is realized by use of tubes which constitute the first gas flow path for transferring the vaporized organometal compound and thus a closed system is established. A cylinder cabinet 20 is placed within an air-circulating constant temperature oven 24 and the pneumatically operated valve 21, the massflow controller 22 and the pneumatically operated valve 23 for interrupting the supply of the vapor of the compound 26 are placed within a separate air-circulating constant temperature oven 25. Moreover, the crystal growth chamber 11 is provided with a heater 12 for establishing a desired temperature therein.

When a semiconductor thin film is prepared by the apparatus shown in FIG. 1, first the cylinder cabinet 20 is heated to a constant temperature by the air-circulating constant temperature oven 24 while the air-circulating constant temperature oven 25 is adjusted to a temperature slightly higher than that of the oven 24. In addition, a substrate 13 is placed in the crystal growth chamber 11 and heated to a desired temperature by the heater 12 and simultaneously the chamber 11 is evacuated by the vacuum pump 14. Upon heating the cylinder cabinet 20, the vapor pressure of the organometal compound is raised and the vaporization of the compound is started. At this stage, working air from its source (not shown) is supplied to the pneumatically controlled valves 21 and 23 to open the same. Thus, the vaporized organometal compound is introduced into the massflow controller 22 through the valve 21 and the massflow thereof is directly detected and determined by the controller 22, and then adjusted to a predetermined constant level. Thereafter, the vaporized organometal compound is supplied to the crystal growth chamber 11 through the valve 23. Thus, an epitaxial thin film of a semiconductor grows on the surface of the substrate 13 within the crystal growth chamber 11. If the thickness of the thin film reaches a desired value, the valve 23 for interrupting the supply of the vaporized organometal compound is closed by supplying the working air from its source to the valve. Thus, the supply of the vaporized organometal compound is almost instantaneously interrupted.

The temperature of the air-circulating constant temperature oven 24 is determined depending on physical properties of the organometal compound such as vapor pressure, melting point and/or thermal stability. If the organometal compound is in the solid state at ordinary temperature, the temperature of the oven 24 is selected so that the vapor pressure thereof can be elevated as high as possible at a temperature of not more than its melting point and that a sufficient heat of vaporization can be continuously supplied to the solid organometal compound. The temperature of the constant temperature oven hence of the organometal compound preferably ranges from 50° to 80° C. If the thermal stability of the solid organometal compound is very high, it may be heated to a temperature of not less than its melting point. On the other hand, the air-circulating constant temperature oven 25 is maintained at a temperature equal to or 10° to 50° C. higher than that of the air-circulating constant temperature oven 24 in order to prevent the condensation of the vaporized organometal compound within the piping inclusive of the massflow controller 22, the valve 21 and the valve 23.

In this apparatus, the vaporization of the organometal compound contained in the cylinder cabinet 20 is performed simply by heating the same without using any carrier gas and, therefore, it is not necessary to take the efficiency of the contact between the carrier gas and the organometal compound into consideration. For this reason, the organometal compound 26 to be introduced into the cylinder cabinet 20 may be in either the solid state or the liquid state and solid may be employed irrespective of their shape or form. The conventional cylinder cabinet 5 (see FIG. 6) used in the MOCVD method requires the use of an inlet valve, an outlet valve 9 and a dip tube 8. On the contrary, the charging and discharging of the starting material can be carried out through only one valve 21 in the apparatus according to the present invention as shown in FIG. 1.

The massflow controller 22 should be designed so that it can be operated at a very low pressure difference, can detect extremely low massflow and can be adjusted. The pressure at the inlet of the massflow controller 22, i.e., on the side of the valve 21 should be adjusted to a level in the order of about several Torrs to several hundred Torrs higher than or preferably at least 20 Torr higher than that observed at the outlet of the controller 22, i.e., on the side of the valve 23 and the crystal growth chamber 11. In this case, it is not necessary to maintain the pressure of the cylinder cabinet 20 and that in the vicinity of the outlet and inlet portions of the massflow controller 22 at ordinary pressure and, therefore, the needle valve for adjusting the pressure used in the conventional apparatus can be omitted.

As is shown in FIG. 2, according to another embodiment of the apparatus of the present invention, a carrier gas for promoting thermal decomposition of the organometal compound such as hydrogen gas can be introduced into the gas flow path for the vaporized organometal compound on the side of the outlet of the massflow controller 22 through a valve 30, a massflow controller 28, a valve 31 and a heat exchanger 29 and thus the heat decomposition of the compound can be promoted. More correctly speaking, this makes it possible to prevent the incomplete heat decomposition of the organometal compound during growing crystals on the substrate 13, the incomplete heat decomposition being caused depending on the temperature of the crystal growth chamber 11 or the ratio of the amount of the Group V starting material to that of the Group III starting material (the ratio of the gaseous starting materials supplied). Thus, a semiconductor thin film of good crystallinity can be obtained. The flow rate of the carrier gas for promoting the heat decomposition of the organometal compound is, in general, not more than several hundred ml/min and preferably ranges from about 10 to 300 ml/min.

In order to make the system clean in the apparatuses shown in FIGS. 1 and 2, the system for supplying the starting materials is evacuated to a pressure of $10^{-5}$ to $10^{-9}$ Torr by the vacuum pump 14 and simultaneously the temperature of the air-circulating constant temperature oven 25 is raised up to 100° to 150° C. to perform baking of the system.

Before or after the apparatus shown in FIG. 3 is used to form semiconductor thin film, the system of the apparatus can be clarified by the use of an inert gas for purging. In this apparatus, a discharge port 33 for discharging an inert gas from its source (not shown) is disposed on the piping present between the valve 21 and the massflow controller 22, through a valve 34. An inert gas for purging is passed through the system in a high flow rate to replace the vaporized organometal compound present therein with the inert gas and thus more complete clarification of the system can be ensured. The inert gas is discharged from the system through a valve 35.

In each apparatus discussed above according to the present invention, the valve 21 and/or valve 23 is used pneumatically having heat resistant and vacuum resistant to perform remote control (see FIG. 1). If such remote control of the valves is not performed, manually operated diaphragm valves may be employed as the valves 21 and 23 (see FIGS. 2 and 3). As is shown in FIG. 5, the cylinder cabinet 20 may be equipped with a manually operated valve 21 and further a pneumatically operated valve 40 may be disposed on the side of the inlet of the massflow controller 22. The cylinder cabinet 20 is preferably made from stainless steel from the viewpoint of the stable storage of the organometal compound and its size is preferably in the order of ⅔ times the volume of the air-circulating constant temperature oven 24.

The present invention will be described hereunder with reference to the following non limitative working Examples and the effects practically achieved by the present invention will also be discussed in comparison with Comparative Example. In these Examples, a thin film of InP/GaAs is formed on a substrate 13 of GaAs.

EXAMPLE 1

In this Example, a deep cold trap was disposed between the crystal growth chamber 11 and the valve 23 of the apparatus shown in FIG. 1 and the quantity of trimethyl indium (TMI) supplied to the crystal growth chamber 11 per unit time was determined.

First, a pressure of $10^{-9}$ Torr was established within the system for supplying the starting material extending from the cylinder cabinet 20 to the crystal growth chamber 11 by the vacuum pump 14 and simultaneously the air-circulating constant temperature oven 25 was heated to 150° C. to perform baking of the system. 100 SCCM (Standard Cubic Centimeter per a Minute) of a carrier gas was introduced into the region between the massflow controller 22 and the valve 23 to maintain the inner pressure of the crystal growth chamber 11 at 50 Torr. Then the temperature of the air-circulating constant temperature ovens 24 and 25 were adjusted to 80° C. and 90° C. respectively. Thereafter, the valve 21 was opened to thus introduce the TMI vapor into the system for supplying the starting material to the chamber 11.

In this respect, the massflow of the TMI vapor was adjusted to $1 \times 10^{-5}$ mol/min by the massflow controller 22. The experiments were performed utilizing two kinds of the cylinder cabinets 20 having different shapes (cylinder of type A and that of type B respectively). Moreover, the experiments were performed by changing the amount of TMI initially charged to the cylinder cabinet 20 (about 25 g and about 50 g). The results obtained are summarized in the following Table I.

TABLE I

| (Example 1) | | | | |
|---|---|---|---|---|
| TMI trap time $\times 10^3$ min | cylinder type A | | cylinder type B | |
| Cylinder inner dia. × height | 36.7 × 85.0 mm | | 42.6 × 130 mm | |
| Amount of TMI introduced (g) | 24.993 | 50.410 | 25.137 | 50.953 |
| Shape of TMI particles | block *1 | block *1 | needle *2 | block *1 |
| Quantity of vaporized TMI supplied (g) 0~0.3 | 4.810 | 4.803 | 4.797 | 4.811 |
| 0.3~0.6 | 4.801 | 4.807 | 4.805 | 4.802 |
| 0.6~0.9 | 4.805 | 4.800 | 4.801 | 4.815 |
| 0.9~1.2 | 4.799 | 4.815 | 4.795 | 4.810 |
| 1.2~1.5 | 4.795 | 4.812 | 4.799 | 4.804 |
| 1.5~1.8 | | 4.809 | | 4.802 |
| 1.8~2.1 | | 4.805 | | 4.813 |
| 2.1~2.4 | | 4.790 | | 4.803 |
| 2.4~2.7 | | 4.787 | | 4.795 |
| 2.7~3.0 | | 4.795 | | 4.785 |
| Amount (g) of remaining TMI observed when not trapped | 0.983 | 0.650 | 1.140 | 1.009 |

*1 Since TMI is sublimated and directly introduced into the cylinder cabinet, it is adhered to the inner wall of the cylinder as a block of 15 mm wide.
*2 Crystals having a size of about 1 mm$\phi$ × 10 mm.

COMPARATIVE EXAMPLE

Figure 6:
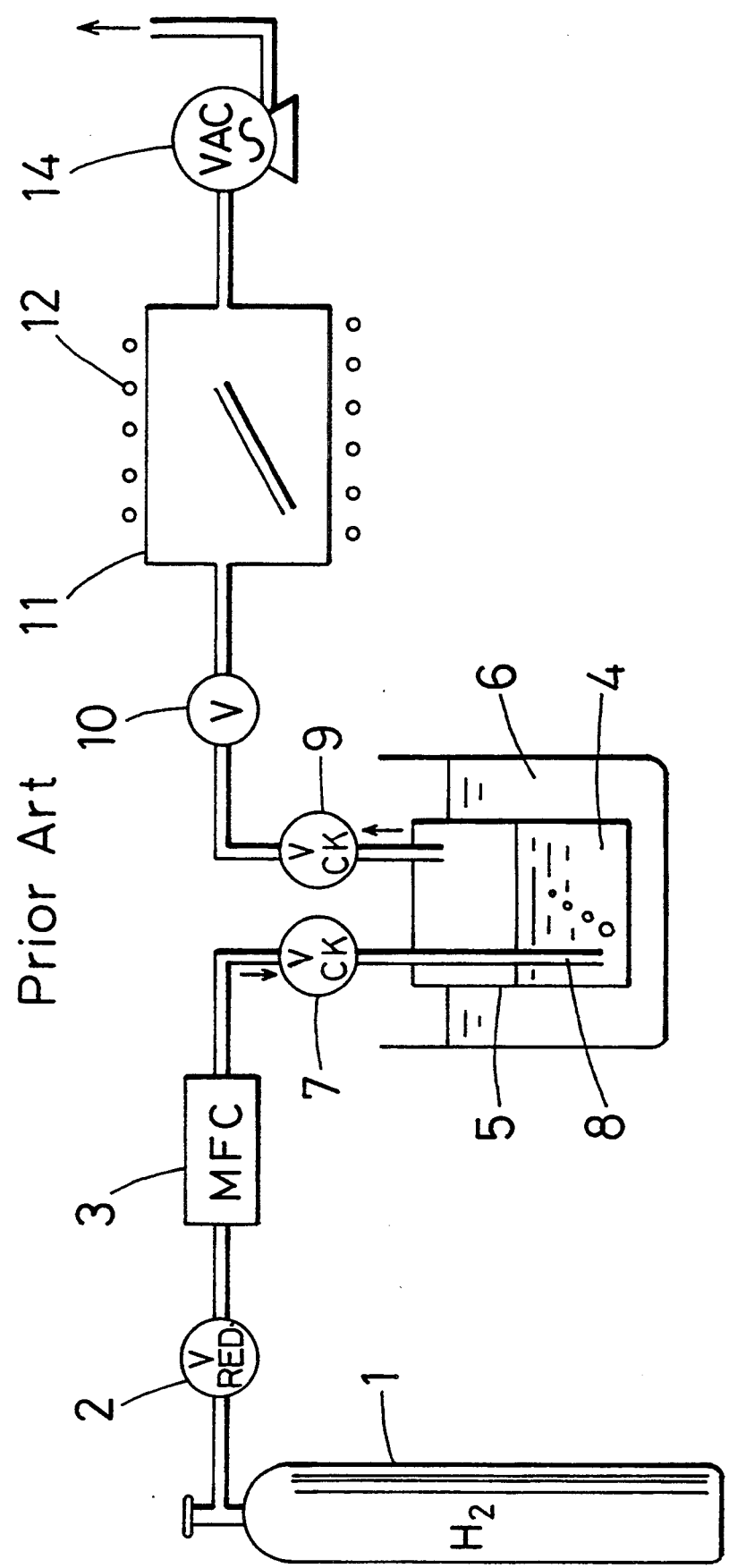
FIG. 6 is a schematic diagram for illustrating the structure of a conventional apparatus for vaporizing an organometal compound and supplying the resulting vapor thereof to a crystal growth chamber.

The same procedures, conditions and devices used in Example were employed to determine change in the flow rate of the TMI vapor except that the apparatus shown in FIG. 6 equipped with a valve for introducing a carrier gas and a dip tube was employed. More specifically, a deep cold trap was disposed between the needle valve 10 and the crystal growth chamber 11 shown in FIG. 6 to determine the quantity of TMI vapor supplied from the cylinder cabinet 20 to the crystal growth chamber 11 per unit time. The internal pressure of the crystal growth chamber 11 was adjusted to 50 Torr by operating the needle valve 10. Experiments were performed under conditions at which the flow rate of TMI was $1 \times 10^{-5}$ mol/min, more specifically the flow rate of hydrogen carrier gas was 100 ml/min. In other words, the temperature of the constant temperature oven was set at 20° C. The results observed are listed in the following Table II.

TABLE II

| (Comparative Example) | | | | |
|---|---|---|---|---|
| TMI trap time × $10^3$ min | cylinder type A | | cylinder type B | |
| Cylinder inner dia. × height | 36.7 × 85.0 mm | | 42.6 × 130 mm | |
| Amount of TMI introduced (g) | 25.947 23.515 | 25.039 | 26.881 | 52.161 |
| Shape of TMI Particles | block needle | needle | block | needle |
| Quantity of vaporized TMI supplied (g) 0~0.3 | 3.608 3.317 | 3.835 | 3.814 | 4.140 |
| 0.3~0.6 | 3.715 4.280 | 3.903 | 3.670 | 4.058 |
| 0.6~0.9 | 3.240 3.940 | 3.383 | 3.300 | 3.940 |
| 0.9~1.2 | 2.888 | 2.934 | 3.077 | 4.011 |
| 1.2~1.5 | 2.875 Clogg- | 2.263 | 2.846 | 4.201 |
| 1.5~1.8 | 2.284 ing of | 2.025 | 2.540 | 3.749 |
| 1.8~2.1 | 1.904 out- | 1.997 | 2.291 | 3.395 |
| 2.1~2.4 | 1.805 lets | 1.862 | 2.004 | 2.704 |
| 2.4~2.7 | 1.573 and/or | 1.680 | 1.380 | 2.466 |
| 2.7~3.0 | 1.219 Valves | 0.907 | 0.527 | 2.438 |
| 3.0~3.3 | | | 0.300 | 2.303 |
| 3.3~3.6 | | | 0.108 | 2.121 |
| 3.6~3.9 | | | | 1.939 |
| 3.9~4.2 | | | | 1.701 |
| 4.2~4.5 | | | | 1.463 |
| 4.5~4.8 | | | | 1.431 |
| 4.8~4.9 | | | | 0.658 |
| 4.9~5.2 | | | | 0.645 |
| 5.2~5.5 | | | | 0.577 |
| 5.5~5.8 | | | | 0.534 |
| 5.8~5.9 | | | | 0.515 |
| 5.9~6.2 | | | | 0.332 |
| 6.2~6.5 | | | | 0.147 |
| Shape of apex of dip Tube (i.d. = 2 mm) | 45° cut | Filter *3 | 45° cut | Filter *3 |

*3 Nupro Filter SS-2F series (available from Nupro Co., Ltd. under the trade name of "INLINE FILTER") having a pore diameter of 15 μm were fitted to the apex of the dip tube. Flow rate of H$_2$ carrier gas is 100 ml/min. Temperature of constant temp. oven is 20°C.

EXAMPLE 2

In this Example, a thin film of InP was formed on a GaAs substrate using TMI as a starting material for the Group III element and PH$_3$ gas diluted to 10% with hydrogen as a starting material for the Group V element. The conditions for growing the thin film were the temperature of the substrate of 700° C. and the internal pressure of the crystal growth chamber 11 of 50 Torr. The amount of TMI supplied was $1.0 \times 10^{-5}$ mol/min and the ratio of the amount of the Group III starting material to that of the Group V starting material was about 1,000. The crystal growth chamber was previously supplied with PH gas stream in order to prevent possible thermal defects of the GaAs substrate surface during rising the temperature of the substrate. The epitaxial film prepared under the foregoing conditions exhibited good physical properties. In other words, there was obtained a semiconductor thin film of high quality having a desired thickness. For instance, it exhibited an electron mobility of 200,000 cm$^2$/Vsec and a carrier concentration of less than $1 \times 10^{13}$ cm$^3$.

The present invention makes it possible to steadily control the amount of the vaporized organometal compound to a desired level irrespective of the shape and the charged amount of the organometal compound as well as the shape of the cylinder cabinet. Therefore, an excellent crystalline thin film having uniform thickness and composition over a large surface area in good reproducibility. A desired vapor pressure can be obtained even if the amount of the organometal compound charged to the cylinder cabinet decreases to a very low level, which results in the effective use of the starting material. Since it is not necessary to manually control the particle size of solid organometal compounds which are difficult to handle and to introduce them into the cylinder cabinet through an inlet, the possibility of the contamination of the starting materials can surely be eliminated and safety in work operations is markedly enhanced. The cylinder cabinet is only provided with a valve for discharging starting materials and the introduction of any carrier gas into the cylinder cabinet is not needed. Therefore, the possibility of back flow of the starting materials due to wrong operations can be completely eliminated. The safety in work operations is also enhanced correspondingly from this viewpoint.

Since it is not necessary to maintain the portions or regions in the vicinity of the inlet and outlet of the cylinder cabinet at ordinary pressure, the pressure variation in the crystal growth chamber can be eliminated. Moreover, since instantaneous interruption and switching or the like of the supply of the starting material can be performed by using an pneumatically operated valve, the sharpness of the crystal growing boundary is substantially improved. In the present invention, it is not necessary to closely control the temperature of the constant temperature oven since the amount of the vaporized organometal compound is directly controlled by a massflow controller. The flow rate of the gaseous organometal compound is always monitored by the massflow controller and, therefore, the total amount of the compound used can easily be evaluated by integrating the monitored values. Thus, the amount of the organometal compound remaining in the cylinder cabinet can be correctly estimated and the time at which the cylinder cabinet should be exchanged can easily be determined.

The supply and interruption of the starting material can be instantaneously performed by introducing a carrier gas (such as hydrogen gas) heated by a heat exchanger into the system at the down stream of the massflow controller, this results in the formation of crystals having a sharp crystal growing boundary. In addition, this ensures the effect of preventing the condensation or adsorption of the starting material on the wall of the piping. Thus, crystals having a stoichiometric composition can be obtained.

As seen from the foregoing excellent effects of the present invention, the invention also makes it possible to substantially save the cost of semiconductor devices manufactured from the growth crystals thus prepared.

What is claimed is:

1. In a method for vaporizing an organometal compound and supplying the vapor produced to a heated substrate surface under reduced pressure in a crystal growth chamber, the improvement which comprises heating the organometal compound in a solid state to a temperature from 50°–80° C. in the absence of a carrier gas to produce a pure vapor of the compound at a vapor pressure greater than the reduced pressure and supplying the vapor at a constant flow rate to the substrate surface.

2. The method of claim 1 wherein the vapor pressure is several to several hundred Torr higher than the reduced pressure.

3. The method of claim 1 wherein the vapor pressure is at least 20 Torr higher than the reduced pressure.

4. The method as set forth in claim 1 wherein the organometal compound is heated up to its melting point.

5. The method as set forth in claim 1 wherein a carrier gas for promoting the thermal decomposition of the organometal compound is used for supplying the vaporized compound to the crystal growth chamber.

6. The method as set forth in claim 5 wherein the flow rate of the carrier gas is adjusted to 10 to 300 ml/min.

7. The method as set forth in claim 1 wherein the vaporized organometal compound is separately heated.

8. The method as set forth in claim 7 wherein the vaporized organometal compound is heated to a temperature 10° to 50° C. higher than that of the organometal compound and supplied to the crystal growth chamber.

9. The method as set forth in claim 1 wherein the organometal compound is a member selected from the group consisting of substituted organometal compounds represented by the following general formulae:

$$R_nM; \quad R_{n-m}MH_m \text{ and } R_{n-m}MX_m$$

(in these general formulas, R represents an alkyl group having 1 to 4 carbon atoms; M represents a metal element of Group II, III, V, or VI of Periodic Table; X represents a halogen atom; and n is an integer of 2 or 3 and m is an integer ranging from 1 to 3).

* * * * *